United States Patent [19]

Bringans et al.

[11] Patent Number: 5,400,356
[45] Date of Patent: Mar. 21, 1995

[54] INDEX-GUIDED LASER ON GROOVED (001) SUBSTRATE

[75] Inventors: Ross D. Bringans; David P. Bour, both of Cupertino, Calif.

[73] Assignee: Xerox Corporation, Stamford, Conn.

[21] Appl. No.: 267,074

[22] Filed: Jun. 28, 1994

[51] Int. Cl.$^6$ .............................................. H01S 3/19
[52] U.S. Cl. ......................................... 372/46; 257/14; 372/45
[58] Field of Search ...................... 372/45, 46; 257/12, 257/13, 14, 79, 94, 96

[56] References Cited

U.S. PATENT DOCUMENTS

| | | | |
|---|---|---|---|
| 4,932,033 | 6/1990 | Miyazwa et al. | 372/46 |
| 5,010,556 | 4/1991 | Imanaka et al. | 372/46 |
| 5,115,443 | 5/1992 | Miyazawa | 372/46 |

OTHER PUBLICATIONS

Bona, G. L.; Unger, P.; Buchan, N. I.; Heuberger, W.; Jakubowicz, A.; Roentgen, P. (Al)GaLnP Laser with Lateral Confinement by Epitaxial Growth on Nonplanar Substrates. IEEE Photonics Technology Letters, vol. 5, No. 10, Oct. 1993, pp. 1125–1128.

Furuya, A.; Kito, Y.; Fukushima, T.; Sugano, M.; Sudo, H.; Anayama, C.; Kondo, M.; Tanahashi, T. Self-Aligned Bend Waveguide (SBW) AlGaLnP Visible Laser Diode with Small Beam Astigmatism. IEEE Journal of Quantum Electronics, vol. 29, No. 6, Jun. 1993, pp. 1869–1873.

*Primary Examiner*—James W. Davie
*Attorney, Agent, or Firm*—John M. Kelly

[57] ABSTRACT

An index-guided semiconductor laser having a grooved waveguide which uses the optical confinement resulting from the bandgap difference between two phases of OMVPE formed AlGaInP, and in which the higher bandgap phase occurs with AlGaInP grown on substrates orientated at angles less than 55 degrees with respect to the (001) plane. The device is fabricated on a (100) orientated substrate having an etched groove. By fabricating the sidewalls with an angle of between 5 degrees and 50 degrees with respect to the (100) plane of the substrate, composition differences between the (100) stripe center and the grooved sidewall are minimized.

20 Claims, 5 Drawing Sheets

INDEX-GUIDED LASER ON GROOVED (001) SUBSTRATE

BACKGROUND OF THE PRESENT INVENTION

Index-guided semiconductor lasers have proven to be useful devices. Index guiding refers to the use of variations in the optical index of refraction between material layers to provide for optical confinement. To fabricate an index-guided semiconductor laser one must use a suitable material system, create an active region, and provide for carrier confinement, radiation confinement, and optical feedback. Modern semiconductor lasers may fulfill these requirements using a heterostructure formed in a suitable material system (such as AlGaInP, AlGaAs, or InGaAsP), a lateral waveguide which provides for optical confinement, and an optical Fabry-Perot cavity formed from cleaved facets.

The following uses the subscripted notation, $A_M L_N$, where the nonsubscript terms (A and L) designate a material (be it an element or a compound) and the subscripted terms (M and N) designate the atomic concentration of their associated material. Additionally, parenthesis are used to identify compounds which act together. For example, the notation $(Al_xGa_{1-x})_{0.5}In_{0.5}P$ implies that half of the material is phosphorous, one quarter is comprised of indium, and the remaining quarter is a compound of aluminum and gallium in which the composition takes a range ($0 \leq X \leq 1$) from all aluminum (the subscripted X is equal to 1) to all gallium (the subscripted X is equal to 0). It is to be understood that the subscripted terms are, in practical materials, only approximations. For example, in a material designated as $(Al_xGa_{1-x})_{0.5}In_{0.5}P$, the subscripted percentages X and 0.5 may vary slightly (such as by $\pm 0.05$). The general alloy $(Al_xGa_{1-x})_yIn_{1-y}P$ will be denoted AlGaInP for convenience.

An important semiconductor laser material system, and one which is particularly useful for fabricating visible light emitting semiconductor lasers, is $(Al_xGa_{1-x})_{0.5}In_{0.5}P$. Importantly, $(Al_xGa_{1-x})_{0.5}In_{0.5}P$ both lattice matches with GaAs substrates and can be grown using organometallic vapor phase epitaxy (OMVPE). Interestingly, OMVPE-grown AlGaInP exhibits two distinct phases: an ordered phase, (consisting of a monolayer $InP/Al_xGa_{1-x}P$ superlattice formed by spontaneous atomic organization during growth) characterized by a lower bandgap; and a random-alloy phase, one with no ordering on the group III sublattice, having a higher bandgap energy. Importantly, the lower bandgap phase occurs when AlGaInP is OMVPE grown on (001) orientated substrates, while the higher bandgap phase occurs when AlGaInP is OMVPE grown on substrates whose surfaces are misorientated from (100) toward (111)A, such as at angles of 5 to 55 degrees (the 111 plane).

One possible way of implementing AlGaInP index-guided semiconductor lasers is to use ridged substrates. In such implementations, lateral optical and electrical confinement results from the refractive index difference and the bandgap energy difference, respectively, between the ordered and random phases of AlGaInP grown on a ridge. However, ridged semiconductor lasers typically have a relatively large planar surface from which relatively small mesas protrude. This is disadvantageous when attempting to heatsink ridged semiconductor lasers since the mesas interfere with the direct mounting of the device on a planar heatsink.

It would be useful to have index-guided semiconductor lasers which achieve index-guiding using phase differences which result from the growth of material on different crystalline planes. Beneficially, such lasers would be directly mountable on a planar heatsink.

A major problem when attempting to grow lattice-matched materials on different crystal planes are composition differences, which introduce strain. Since different AlGaInP compositions generally result from OMVPE growth on different crystal planes, it is difficult to prepare dislocation-free (lattice-matched) materials on structured substrates. Strain limits the usable thickness of a lattice-mismatched epitaxial layer. For example, when growing AlGaInP on GaAs to achieve a desired alloy composition it is critically important to ensure lattice-matched layers (unstrained, and free of dislocations). For a mismatched layer (whose composition does not match the lattice parameter of GaAs), if the critical thickness is exceeded, misfit dislocations appear which significantly degrade the optical and electrical properties of the resulting semiconductor layers.

SUMMARY OF THE INVENTION

In accordance with the present invention there is provided index-guided semiconductor lasers having grooved waveguides which use the optical confinement resulting from the refractive index difference between a semiconductor material grown on a bottom surface of the groove and a semiconductor material grown on the groove's sidewalls. Beneficially, the substrate is substantially (001) GaAs and the phase difference results from OMVPE-grown AlGaInP on both a (001) bottom surface of the groove and on the groove's sidewalls. Since the bandgap difference between the two phases (a random phase and an ordered phase) of the AlGaInP is large, being about 100 meV in the case of $(Al_xGa_{1-x})_{0.5}In_{0.5}P$, and since the refractive index of the AlGaInP on the groove's sidewalls is also necessarily lowered over that of the AlGaInP on the groove's bottom surface, both lateral carrier and optical confinement are obtained. Furthermore, for sidewall angles less than 55 degrees (i.e., less than the (111)A plane) the composition differences, and consequentially the strain, between the AlGaInP on the sidewalls and on the bottom of the groove are reduced over that of AlGaInP OMVPE-grown on the (100)- and (111)A planes.

BRIEF DESCRIPTION OF THE DRAWINGS

Other aspects of the present invention will become apparent as the following description proceeds and upon reference to the drawings, in which.

The following text includes directional signals (such as right, left, up, down, top, bottom, lower and upper) which are taken relative to the drawings. Those signals are only meant to aid the understanding of the present invention, not to limit it.

DETAILED DESCRIPTION OF THE ILLUSTRATED EMBODIMENT

Subsequently described as illustrative embodiments are AlGaInP index-guided semiconductor lasers having grooved waveguides which achieve optical confinement because of the bandgap differences between OMVPE-grown AlGaInP on the bottom surface of the grooves ((001) surfaces) and OMVPE-grown AlGaInP on the sidewalls of the groove. Since different AlGaInP compositions result when AlGaInP is OMVPE-grown on different planes, strain between the different compositions and the substrate result. These strains make it somewhat difficult to prepare dislocation-free (lattice-matched) AlGaInP materials on grooved substrates. Since it is important to ensure lattice-matched layers (relatively unstrained and free of dislocations), the composition differences effectively limit the usable thicknesses of the AlGaInP growths. For a mismatched layer (one whose composition does not match the lattice parameter of GaAs), if the critical thickness is exceeded, misfit dislocations appear which significantly degrade the optical and electrical properties of the semiconductor layers. This limitation is important when implementing the illustrative embodiments. While the above describes a limitation of AlGaInP index-guided semiconductor lasers with grooved waveguides, similar problems exist with other material systems.

The illustrative embodiment semiconductor lasers are all based upon the $(Al_xGa_{1-x})_{0.5}In_{0.5}P$ material system. Since $(Al_xGa_{1-x})_{0.5}In_{0.5}P$ has a high, direct bandgap, it is a useful material system for visible laser diodes and light-emitting diodes. Furthermore, since $(Al_xGa_{1-x})_{0.5}In_{0.5}P$ lattice matches well with GaAs, a desirable integration of GaAs and $(Al_xGa_{1-x})_{0.5}In_{0.5}P$ is achieved.

When $(Al_xGa_{1-x})_{0.5}In_{0.5}P$ is grown using organometallic vapor phase epitaxial (OMVPE) growth on (001) GaAs, the AlGaInP layer spontaneously orders and forms a monolayer $Al_xGa_{1-x}P/InP$ superlattice along the {111} planes (crystal ordering occurs along 2 of the 4 {111} variants). However, when $(Al_xGa_{1-x})_{0.5}In_{0.5}P$ is OMVPE grown on a GaAs substrate whose orientation is tilted from the (001) plane, a random-alloy phase having a higher bandgap than the ordered phase occurs. Essentially, by tilting toward the {111}A planes, the ordering diminishes as the angle $\theta$ increases. For angles between about 5° and 60° the ordering is eliminated and the random alloy grows naturally. Therefore, the bandgap and the refractive index of $(AlGa)_{0.5}In_{0.5}P$ grown on GaAs depends upon the orientation of the substrate upon which it is grown. This property is used in the illustrative embodiments to achieve optical and electrical confinement.

Figure 1:
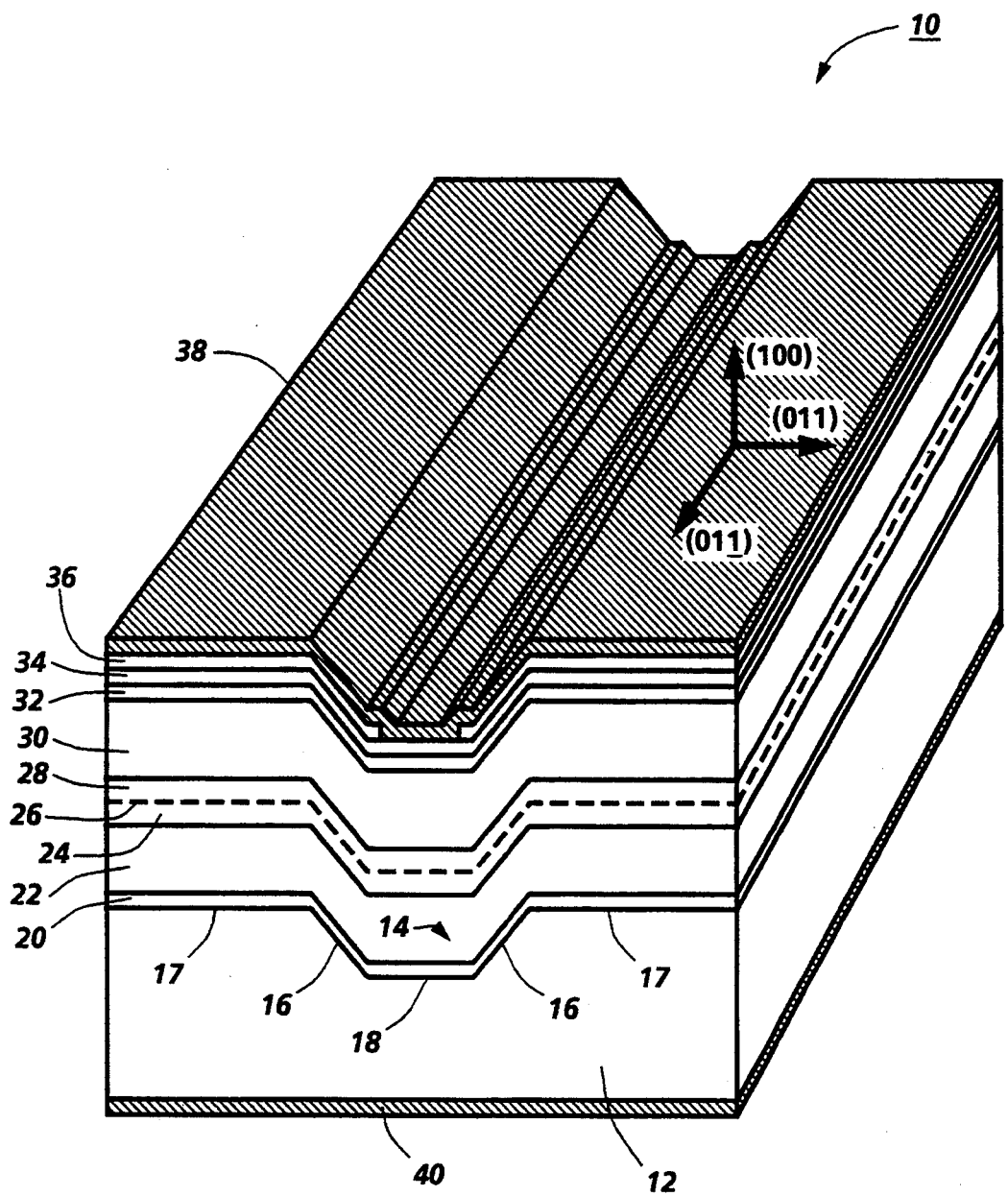
FIG. 1 shows a single quantum well laser according to the principles of the present invention.

The first illustrative laser 10, shown in FIG. 1, is fabricated on a (001) orientated, n-doped GaAs substrate 12 that has been etched to have a groove 14. The groove is defined by two sidewalls 16 which dip down from the upper surface 17 of the substrate and by a bottom surface 18 which is substantially parallel to the upper surface 17 of the substrate. The two sidewalls 16 form angles $\theta$ with the upper surface 17 such that $\theta$ is between about 5 and 60 degrees. However, (because of strain induced in the subsequently described OMVPE-grown layers) it is beneficial to make at least one of the angles $\theta$ (they need not be the same) less than 55°. While the substrate 12 and the bottom surface 18 are described as being (001) orientated, in practice it may be better to offset them (and consequentially the subsequently described layers which are grown over them) from the (001) plane by as much as ±5°. Thus it is to be understood that all references to the (001) plane herein, including in the claims, carry a tolerance of at least 5°.

Still referring to FIG. 1, over the substrate 12 and groove 14 is grown a thin n-doped GaAs buffer layer 20. While a buffer layer is not required, it does assist growth of subsequent layers. The buffer layer covered sidewalls 16 and bottom surface 18 form planes on which subsequent layers having plane dependent characteristics are grown using OMVPE. Over the buffer layer is an OMVPE-grown n-doped $(Al_xGa_{1-x})_{0.5}In_{0.5}P$ (where $0.4<x<1.0$) lower cladding layer 22. Over that lower cladding layer is an OMVPE-grown $(Al_xGa_{1-x})_{0.5}In_{0.5}P$ (where $0.1<x<0.7$) lower confining layer 24. Over that lower confining layer is an OMVPE-grown $(Al_xGa_{1-x})_yIn_{1-y}P$ active region 26. Over the active region is an OMVPE-grown p-type $(Al_xGa_{1-x})_{0.5}In_{0.5}P$ ($0.1<x<0.7$) upper confining layer 28. Over the upper confining layer 28 is an OMVPE-grown p-doped $(Al_xGa_{1-x})_{0.5}In_{0.5}P$ ($0.4<x<1.0$) upper cladding layer 30.

With the active layer and the confining and cladding layers in place, various additional layers are grown to assist in achieving electrical contact and confinement. Over the upper cladding layer 30 is a P-doped $Ga_{0.5}In_{0.5}P$ barrier reduction 32 layer, followed by a P-doped GaAs cap layer 34. Over most of the cap layer 34 is an insulating layer 36 of $Si_3N_4$ or $SiO_2$. However, the insulating layer over the bottom of the groove is removed to expose part of the cap layer 34. Alternatively, a proton implant, or a deposited n-type current-blocking layer could also be used to restrict contact to the laser stripe region. The laser stripe region is the portion of the active region 26 over the bottom of the groove 14. A p-type contact 38 is fabricated over the insulating layer 36 and the exposed portion of the cap layer 34. The insulating layer covers the remainder of the wafer surface and acts to improve current-isolation. Finally, an n-type ohmic contact 40 is deposited onto the bottom of the substrate 12.

Figure 2:
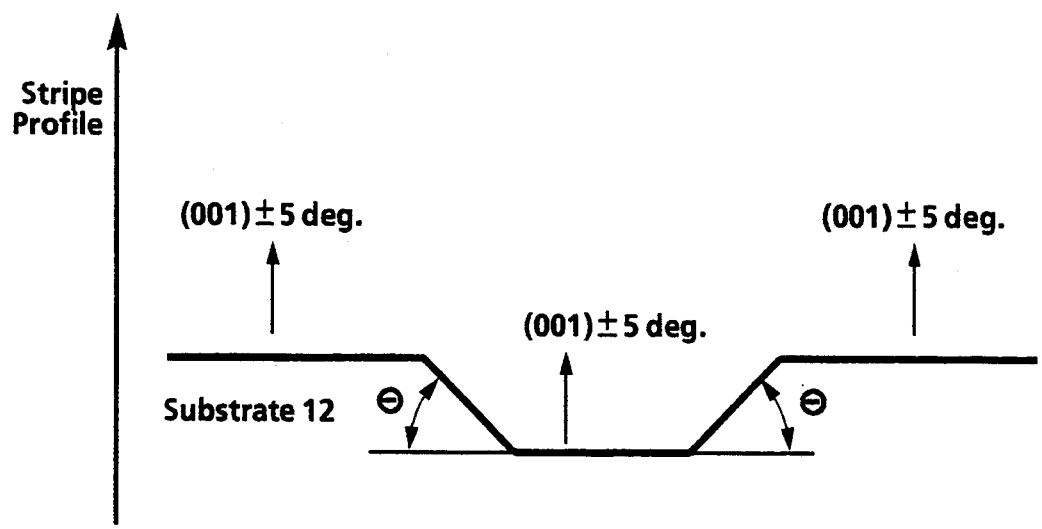
FIG. 2 shows the bandgap energy profile of the laser of FIG. 1.
Figure 2:
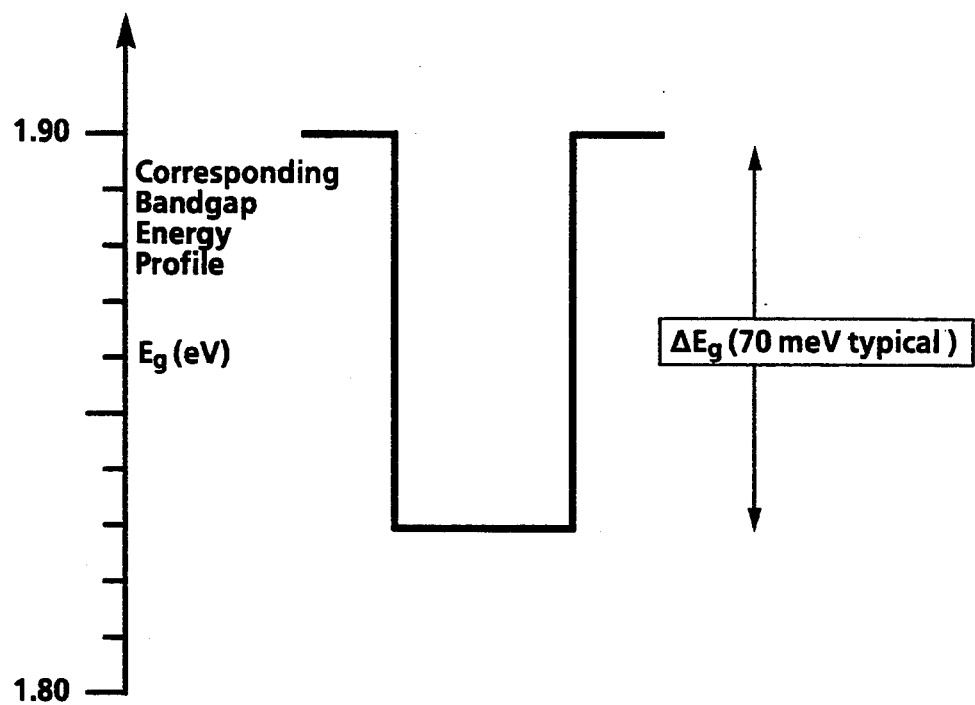

As a result of the bandgap difference between the ordered alloy of AlGaInP on the (001) planar surface, and the random alloy on the sidewalls, carriers are confined to the center of the laser stripe. Since the bandgap energy (shown in FIG. 2) is lowest in the stripe center, carriers are confined to this region. Importantly, in the illustrated embodiment the lateral current confinement is automatic since it relies solely on the growth properties of GaInP. Thus, the bandgap difference between the ordered and random phases of AlGaInP provides lateral carrier confinement in a narrow stripe laser. This lowers threshold current by reducing current spreading and ensures that the gain profile is coincident with the optical mode.

Figure 3:
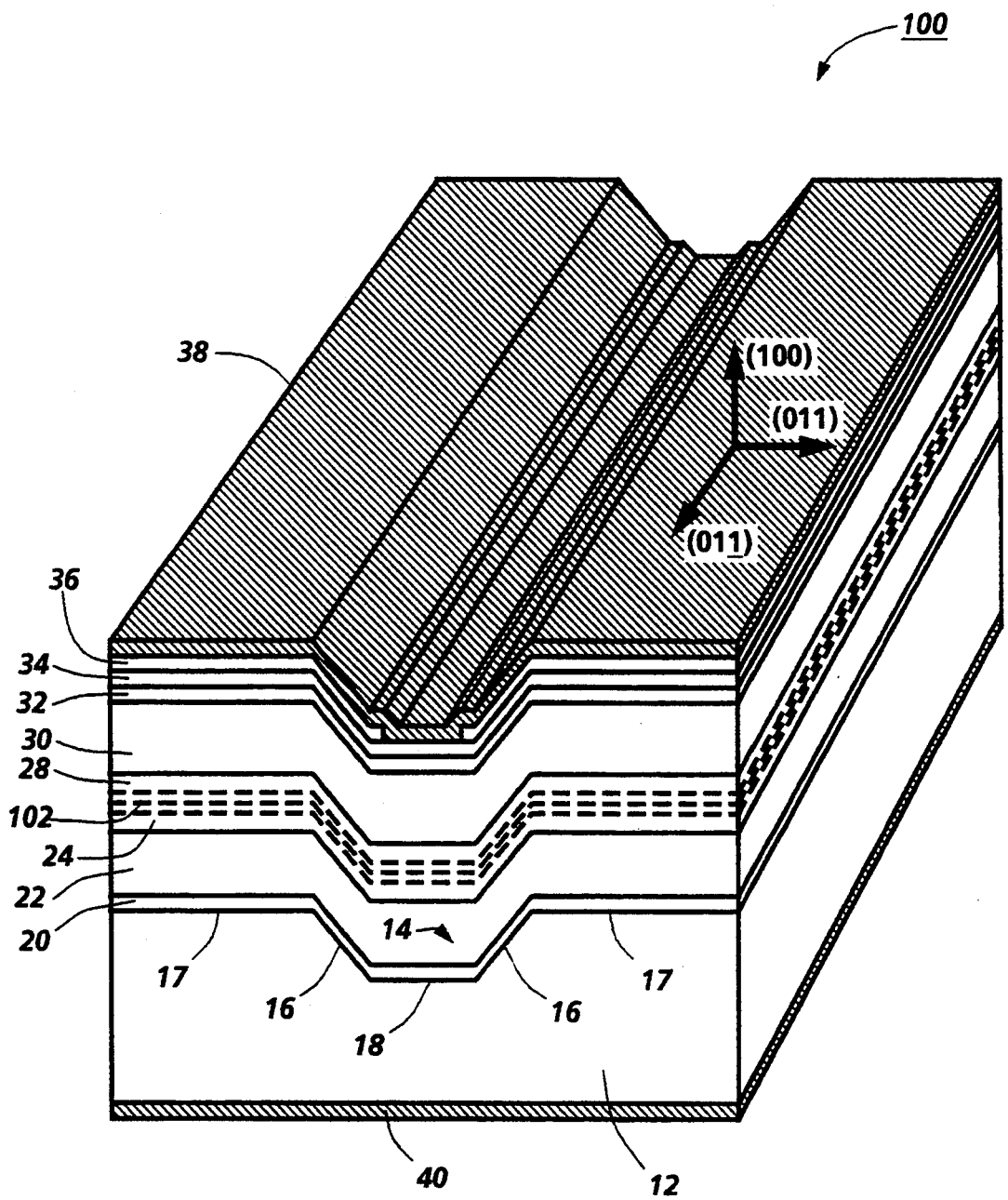
FIG. 3 shows a multiple quantum well laser according to the principles of the present invention.

While the illustrative embodiment laser 10 contains only a single quantum well active region (the active region 26), as indicated by FIG. 3, the principles of the present invention are also usable with multiple quantum well lasers. Referring to FIG. 3, the illustrative laser 100 is structurally similar to the laser 10, except that the single active region 26 is changed to a multiple well structure 102 (in FIG. 3, three wells are indicated). In such lasers $(Al_xGa_{1-x})_{0.5}In_{0.5}P$ barrier layers can be used to separate the various quantum wells.

Figure 4:
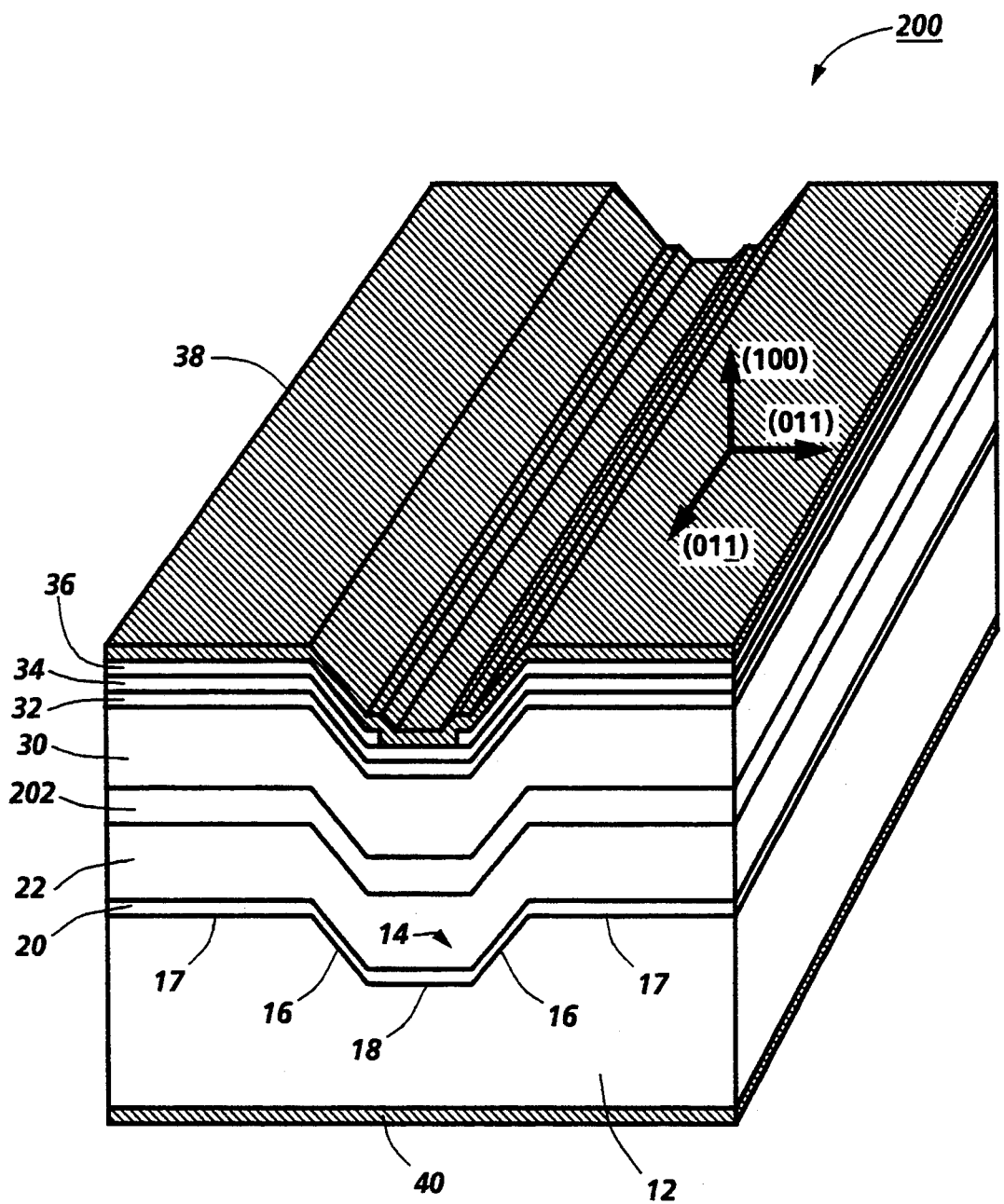
FIG. 4 shows a double heterostructure laser according to the principles of the present invention.
Figure 5:
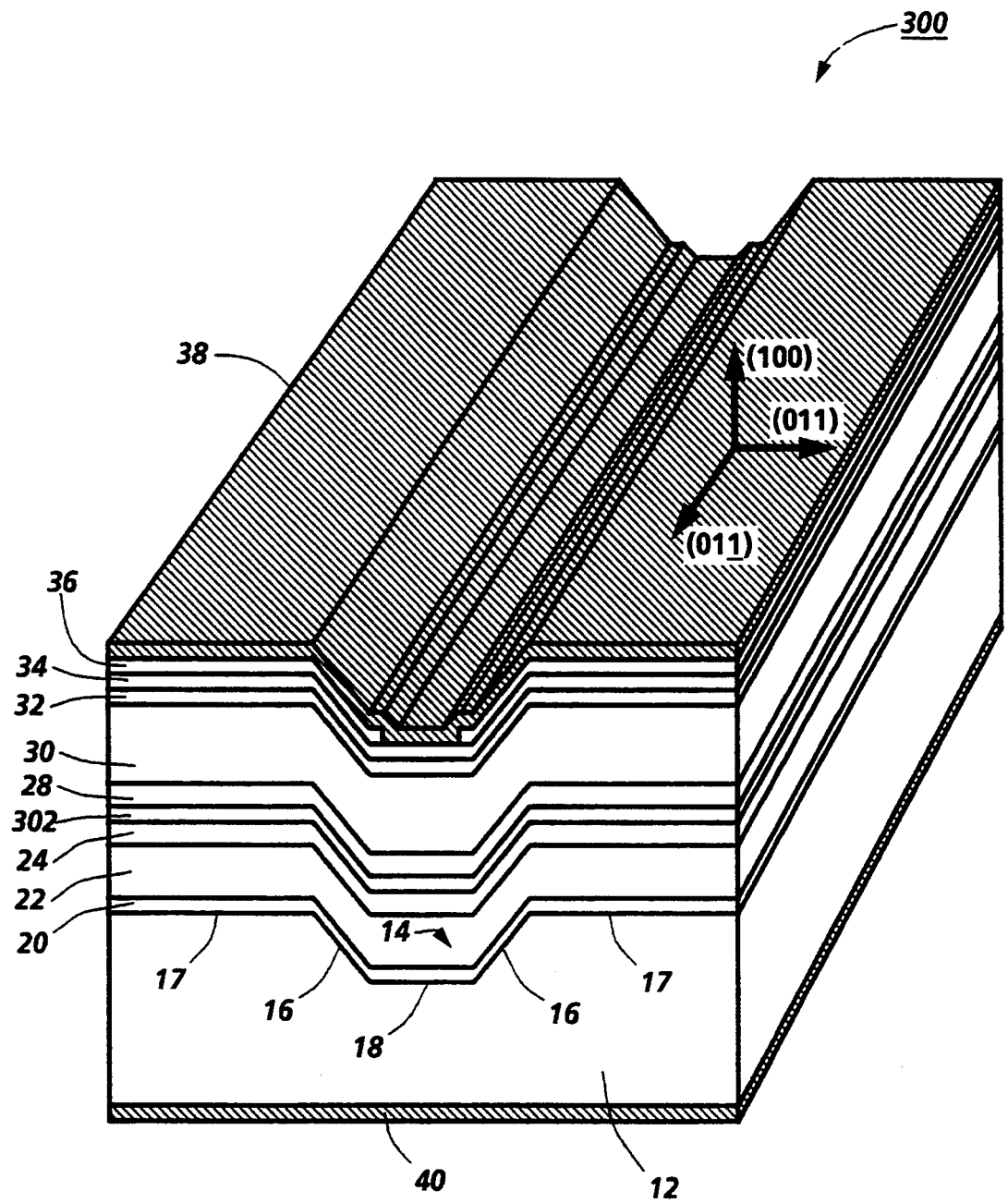
FIG. 5 shows a separate confinement heterostructure laser according to the principles of the present invention.

Furthermore, as indicated by FIGS. 4 and 5, the principles of the present invention are also usable with double heterostructure lasers. Referring to FIG. 4, the illustrative laser 200 is structurally similar to the laser 10, except that the lower and upper confining layers 24 and 28 are removed and the active region 26 is changed. The active region 202 is a 200–2000 Å thick layer of undoped $(Al_xGa_{1-x})_{0.5}In_{0.5}P$. Referring to FIG. 5, the illustrative laser 300 is structurally similar to the laser 10, except that the active region 26 is changed. The active region 302 is a 200–2000 Å thick layer of undoped $(Al_xGa_{1-x})_{0.5}In_{0.5}P$.

Fabrication of the Illustrated Embodiment

Fabrication of the AlGaInP laser 10 involves patterning the GaAs substrate 12 and then forming a groove, for example by etching with 1HF: $xH_2O_2$: $10H_2O$, along the [0$\bar{1}$1] direction. This etchant (HF: $xH_2O_2$: $10H_2O$) results in a groove whose sidewall angle depends on the etch composition (x). The GaAs buffer layer 20 is then grown over the substrate/groove. Importantly, the bottom of the groove maintains its (100) orientation. Following the GaAs buffer layer, the various AlGaInP layers are then grown using OMVPE.

The growth rates and compositions on the different crystal planes depend upon the OMVPE growth conditions, primarily upon the growth temperature. The AlGaInP laser 10 (FIG. 1) has roughly conformal growth, with the substrate features continuing with the growth. Under some growth conditions, however, the geometry can be altered as the layers are grown. Thus, it could be possible to change the stripe width and shape during growth. Similarly, the composition of the grown layer is influenced by the plane of growth. Deviations from lattice match need to be minimized, however, in order to suppress the formation of misfit dislocations in material grown on the groove's sidewalls. Since composition differences between the (100) groove surface and the angled sidewall are reduced as the sidewall angle $\theta$ is made smaller, growth on shallow grooves minimizes any mismatch strain. Therefore, the typical high-performance AlGaInP laser structures (identical to those grown on planar substrates) can likewise be prepared on shallow grooves. Consequently, the advanced structures for short-wavelength and low threshold/high efficiency operation are viable, and the reduced-phosphide alloy structures (with, for example, partial AlGaAs cladding) are not necessary.

From the foregoing, numerous modifications and variations of the principles of the present invention will be obvious to those skilled in its art. Therefore the scope of the present invention is to be defined by the appended claims.

What is claimed:

1. A semiconductor device comprising:
   a substantially (001) substrate doped with receptors for carriers of a first conductivity type, said substrate having a first and second surfaces which are substantially parallel to each other, said substrate further having third and fourth surfaces which join said first and second surfaces so that said second, third, and fourth surfaces form a groove and such that said third surface is declined from the first surface a minimum of 5 degrees and a maximum given by the {111} plane;
   a first cladding layer doped with receptors for carriers of said first conductivity type and which covers said groove and at least part of said first surface of said substrate such that said first cladding layer follows the contours of said groove;
   an active region adjacent to said first cladding layer and disposed over said groove such that said active region follows the contours of said groove, said active region having a first phase with a first bandgap on planes substantially parallel to said first surface and a second phase with a second bandgap which occurs on planes substantially parallel to said third surface and a third bandgap on planes substantially parallel to said fourth surface;
   a second cladding layer doped with receptors for carriers of a second conductivity type and which covers said active region and said groove; and
   means for injecting current into said active layer;
   wherein said first and second cladding layers are semiconductor materials having bandgaps different than said first, second, and third bandgaps.

2. The semiconductor device according to claim 1, further including a buffer layer disposed between said substrate and said first cladding layer.

3. The semiconductor device according to claim 1, wherein said active region includes a quantum well.

4. The semiconductor device according to claim 1, wherein said active region includes a multiple quantum well.

5. The semiconductor device according to claim 1, wherein said active region includes a double heterostructure.

6. The semiconductor device according to claim 1, further including a first confining layer disposed between said first cladding layer and said active region and a second confining layer disposed between said active region and said second cladding layer.

7. The semiconductor device according to claim 6, wherein said active region includes a quantum well.

8. The semiconductor device according to claim 6, wherein said active region includes a multiple quantum well.

9. The semiconductor device according to claim 6, wherein said active region includes a double heterostructure.

10. The semiconductor device according to claim 1, wherein said active region is comprised of $(Al_xGa_{1-x})_yIn_{1-y}P$.

11. The semiconductor device according to claim 10, wherein said active region includes a double heterostructure.

12. The semiconductor device according to claim 10, further including a first confining layer disposed between said first cladding layer and said active region and a second confining layer disposed between said active region and said second cladding layer.

13. The semiconductor device according to claim 12, wherein said active region includes a quantum well.

14. The semiconductor device according to claim 13, wherein said active region includes a multiple quantum well.

15. The semiconductor device according to claim 14, wherein said active region includes a double heterostructure.

16. The semiconductor device according to claim 10, wherein said first and second cladding layers are comprised of $(Al_xGa_{1-x})_yIn_{1-y}P$, where $0.4 \leq X \leq 1.0$ and $Y = 0.5 \pm 0.05$.

17. The semiconductor device according to claim 16, wherein said active region includes a double heterostructure.

18. The semiconductor device according to claim 17, further including a first confining layer disposed between said first cladding layer and said active region and a second confining layer disposed between said active region and said second cladding layer.

19. The semiconductor device according to claim 18, wherein said active region includes a quantum well.

20. The semiconductor device according to claim 19, wherein said active region includes a double heterostructure.

* * * * *